United States Patent
Ogawa et al.

(10) Patent No.: US 10,149,395 B2
(45) Date of Patent: Dec. 4, 2018

(54) WATER-BASED ORGANIC SOLDERABILITY PRESERVATIVE, AND ELECTRONIC BOARD AND SURFACE TREATMENT METHOD USING THE SAME

(71) Applicant: TAMURA CORPORATION, Tokyo (JP)

(72) Inventors: Yasutaka Ogawa, Iruma (JP); Kazutaka Nakanami, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 15/591,230

(22) Filed: May 10, 2017

(65) Prior Publication Data

US 2017/0327702 A1  Nov. 16, 2017

(30) Foreign Application Priority Data

May 12, 2016 (JP) ................................. 2016-096107

(51) Int. Cl.
| | | |
|---|---|---|
| H05K 3/00 | (2006.01) | |
| H05K 3/28 | (2006.01) | |
| C09D 7/20 | (2018.01) | |
| C09D 7/63 | (2018.01) | |

(52) U.S. Cl.
CPC ............... *H05K 3/282* (2013.01); *C09D 7/20* (2018.01); *C09D 7/63* (2018.01); *H05K 2203/124* (2013.01)

(58) Field of Classification Search
None
See application file for complete search history.

(56) References Cited

U.S. PATENT DOCUMENTS

| 7,775,417 B2 * | 8/2010 | Shoji | H05K 3/3484 228/233.2 |
|---|---|---|---|
| 7,794,531 B2 * | 9/2010 | Abys | B23K 35/3612 106/14.05 |
| 2012/0097754 A1 * | 4/2012 | Vlad | A61L 9/01 239/6 |
| 2014/0020932 A1 * | 1/2014 | Minami | H05K 3/389 174/251 |

FOREIGN PATENT DOCUMENTS

| CN | 101697662 B | * | 4/2011 |
|---|---|---|---|
| JP | H06-322551 | | 11/1994 |
| JP | H07-054169 A | | 2/1995 |
| JP | 2009-04761 A | | 3/2009 |
| JP | 2014-101553 A | | 6/2014 |
| JP | 2015-048502 A | | 3/2015 |
| JP | 2015-132009 A | | 7/2015 |

OTHER PUBLICATIONS

DOW P-Series Glycol Ethers and E-Series Glycol Ethers (Year: 2002).*
English translation of CN101697662B (Year: 2011).*
Japanese Office Action dated Jul. 10, 2018 with English translation, 5 pages.

* cited by examiner

*Primary Examiner* — Melvin C. Mayes
*Assistant Examiner* — Stefanie J Cohen
(74) *Attorney, Agent, or Firm* — Ranklin, Hill & Clark LLP

(57) ABSTRACT

A water-based organic solderability preservative includes (A) an imidazole compound, (B) an organic acid, (C) a complex coating formation aid, (D) an organic solvent and (E) water. The component (D) (organic solvent) has a solubility to water of 10 g/100 g or more at 20 degrees C. and a boiling temperature in a range from 100 degrees C. to 300 degrees C.

11 Claims, No Drawings

WATER-BASED ORGANIC SOLDERABILITY PRESERVATIVE, AND ELECTRONIC BOARD AND SURFACE TREATMENT METHOD USING THE SAME

The entire disclosure of Japanese Patent Application No. 2016-096107 filed May 12, 2016 is expressly incorporated by reference herein.

TECHNICAL FIELD

The present invention relates to a water-based organic solderability preservative (water-based preflux), and an electronic board and a surface treatment method using the water-based organic solderability preservative.

BACKGROUND ART

Many printed circuit boards are distributed with a solder resist coating being formed thereon. In this case, though most of the surfaces of the printed circuit boards are covered with the solder resist coating, no solder resist coating is present on an electrode terminal (land) in order to mount electronic components. Accordingly, the surface of the electrode terminal is likely to be oxidized during distribution and/or storage of the printed circuit boards. In view of the above, gold plating is sometimes applied on the surface of the electrode terminal of the printed circuit board in order to prevent the oxidation of the surface of the electrode terminal. However, the use of noble metal (gold) for the gold plating necessarily increases the production cost. Accordingly, instead of applying the gold plating, a protection coating is formed on surfaces of electrode terminals of printed circuit boards using a water-based organic solderability preservative (see, for instance, Patent Literature 1: JP 6-322551 A).

A typical water-based organic solderability preservative as disclosed in Patent Literature 1 entails a problem of crystallization of an imidazole compound contained in the water-based organic solderability preservative when the water-based organic solderability preservative is stored at a low temperature (e.g. 5 degrees C. or less). Thus, it is demanded for the water-based organic solderability preservative to be capable of being stored in a low-temperature environment (low-temperature stability).

Since the imidazole compound in the water-based organic solderability preservative is not or poorly soluble to water, the water-based organic solderability preservative is usually dissolved in water with an assistance of an organic acid such as acetic acid. Though the properties including the low-temperature stability of varieties of types of imidazole compounds and organic acids have been studied, no combination of the imidazole compound and the organic acid exhibiting sufficient low-temperature stability has been found. In order to improve the low-temperature stability of the water-based organic solderability preservative, an organic solvent such as alcohols in which imidazole compounds can be dissolved may be used. However, the use of the organic solvent such as alcohols in order to improve the low-temperature stability results in difficulty in the formation of the protection coating of the imidazole compound on the surface of the electrode terminal. As described above, it has been very difficult to improve the low-temperature stability while keeping the formation performance of the protection coating.

SUMMARY OF THE INVENTION

An object of the invention is to provide a water-based organic solderability preservative having excellent low-temperature stability, and an electronic board and a surface treatment method using the water-based organic solderability preservative.

After dedicated studies in order to achieve the above object, the inventors of the invention have reached the following findings. Specifically, when an organic solvent is added to a water-based organic solderability preservative containing an imidazole compound, an organic acid and a complex coating formation aid, the low-temperature stability usually improves but the formation performance of the protection coating usually deteriorates. However, it is surprisingly found that the use of an organic solvent satisfying specific requirements leads to an improvement in the low-temperature stability while keeping the formation performance of the protection coating, thereby achieving the invention.

A water-based organic solderability preservative according to an aspect of the invention includes (A) an imidazole compound, (B) an organic acid, (C) a complex coating formation aid, (D) an organic solvent and (E) water. The component (D) (organic solvent) has a solubility to water of 10 g/100 g or more at 20 degrees C. and a boiling temperature in a range from 100 degrees C. to 300 degrees C.

In the water-based organic solderability preservative according to the above aspect of the invention, it is preferable that the component (A) in the form of the imidazole compound is a compound represented by a formula (1), In the formula (1), X and Y may be mutually the same or different and each represent at least one of an atom or a group selected from the group consisting of a linear or branched alkyl group having 1 to 7 carbon atoms, a halogen atom, an amino group, a di-lower alkyl-amino group, a hydroxy group, a lower alkoxy group, a cyano group, an acetyl group, a benzoyl group, a carbamoyl group, a formyl group, a carboxyl group, a lower alkoxycarbonyl group and nitro group, n represents an integer in a range from 0 to 4, m represents an integer in a range from 0 to 10 and p represents an integer in a range from 0 to 4.

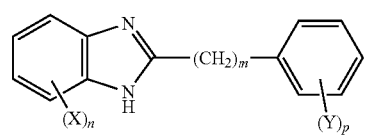

(1)

In the water-based organic solderability preservative according to the above aspect of the invention, it is preferable that the component (D) in the form of the organic solvent is at least one selected from the group consisting of tripropylene glycol monomethyl ether, triethylene glycol monobutyl ether, propylene glycol monomethyl ether, tetraethylene glycol dimethyl ether, tetrahydrofurfuryl alcohol, and propylene glycol monomethyl ether acetate.

An electronic board according to another aspect of the invention includes a protection coating formed from the above-described water-based organic solderability preservative.

A surface treatment method according to still another aspect of the invention includes: forming a protection coating on an electrode terminal of an electronic board using the above-described water-based organic solderability preservative.

According to the invention, a water-based organic solderability preservative having excellent low-temperature stability, and an electronic board and a surface treatment method using the water-based organic solderability preservative can be provided.

DESCRIPTION OF EMBODIMENT(S)

A water-based organic solderability preservative of an exemplary embodiment of the invention includes (A) an imidazole compound, (B) an organic acid, (C) a complex coating formation aid, (D) an organic solvent and (E) water, as will be described below.

Component (A)

Known imidazole compounds are usable for the component (A) imidazole compound of the exemplary embodiment. The component (A) is preferably a compound represented by a formula (1) below in terms of the performance of the protection coating to be formed

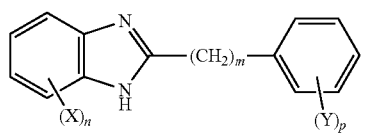

(1)

In the formula (1), X and Y may be mutually the same or different and each represent at least one selected from the group consisting of a linear or branched alkyl group having 1 to 7 carbon atoms, a halogen atom, an amino group, a di-lower alkyl-amino group, a hydroxy group, a lower alkoxy group, a cyano group, an acetyl group, a benzoyl group, a carbamoyl group, a formyl group, a carboxyl group, a lower alkoxycarbonyl group and a nitro group, n represents an integer in a range from 0 to 4, m represents an integer in a range from 0 to 10 and p represents an integer in a range from 0 to 4.

Examples of the halogen atom include a chlorine atom, a bromine atom and an iodine atom. Among the above, in order to improve solder wettability of the electrode terminal, a chlorine atom and a bromine atom are preferable and a chlorine atom is especially preferable.

Examples of the compounds represented by the formula (1) include 2-(3-chloro)benzylbenzimidazol, 2-(3,4-dichloro)benzylbenzimidazol, 4-chloro-2-(3-phenyl propyl) benzimidazol, 6-chloro-2-(2-nitrophenyl)ethyl benzimidazol, and 6-carboethoxy-2-(3-bromobenzyl)benzimidazol. Among the above, in order to restrain the oxidization of the surface of the electrode terminal, 2-(3-chloro)benzylbenzimidazol, 2-(3,4-dichloro)benzylbenzimidazol, and 4-chloro-2-(3-phenyl propyl)benzimidazol are more preferable. Further, these compounds may be singularly used or a mixture of two or more of the compounds may be used.

The content of the component (A) is preferably in a range from 0.01 mass % to 10 mass % of a total mass (100 mass %) of the water-based organic solderability preservative, more preferably in a range from 0.05 mass % to 5 mass %. A coating film such as an anti-corrosion film is more easily formable with the content at or more than the above lower limit. When the content exceeds the above upper limit, insoluble components are liable to increase. In addition, excessive amount of the component (A) is not economically preferable.

Component (B)

Examples of the component (B) (organic acid) of the exemplary embodiment include formic acid, acetic acid, propionic acid, butanoic acid, glycolic acid, tartaric acid, lactic acid, chloroacetic acid, dichloroacetic acid, trichloracetic acid, bromoacetic acid and methoxyacetic acid. Among the above, formic acid and acetic acid are preferable. Further, these organic acids may be singularly used or a mixture of two or more of the organic acids may be used.

The content of the component (B) is preferably in a range from 1 mass % to 40 mass % of the total mass (100 mass %) of the water-based organic solderability preservative, more preferably in a range from 1 mass % to 20 mass % and especially preferably in a range from 1 mass % to 10 mass %. When the content is less than the above lower limit, the imidazole compound for forming the coating film tends not to be easily dissolved. On the other hand, when the content exceeds the upper limit, the formation performance for the protection coating is likely to be deteriorated.

Component (C)

Examples of the component (C) (complex coating formation aid) of the exemplary embodiment include metal compounds such as copper formate, copper(I) chloride, copper (II) chloride, copper oxalate, copper acetate, copper hydroxide, copper carbonate, copper phosphate, copper sulfate, manganese formate, manganese chloride, manganese oxalate, manganese sulfate, zinc acetate, lead acetate, nickel acetate, barium acetate, zinc hydride, iron(I) chloride, iron (II) chloride, iron(I) oxide, iron(HI) oxide, copper iodide, potassium iodide, zinc iodide, copper(I) bromide, copper(II) bromide, potassium bromide, and zinc bromide. Among the above, in order to improve solder wettability and heat resistance, a zinc chloride, copper bromide and potassium iodide are preferable. Further, these metal compounds may be singularly used or a mixture of two or more of the metal compounds may be used.

The content of the component (C) is preferably in a range from 0.01 mass % to 10 mass % of the total mass (100 mass %) of the water-based organic solderability preservative, more preferably in a range from 0.05 mass % to 5 mass %. When the content of the component (C) is less than the above lower limit, the improvement in the formation performance for the protection coating tends to be insufficient. On the other hand, when the content of the component (C) exceeds the above upper limit, the formation performance for the protection coating tends to be excessive and liquid stability at a low temperature tends to be lowered.

Component (D)

It is necessary for the component (D) (organic solvent) used in the exemplary embodiment to have solubility to water of 10 g/100 g or more at 20 degrees C., and a boiling temperature in a range from 100 degrees C. to 300 degrees C. The presence of the component (D) improves the low-temperature stability of the water-based organic solderability preservative.

In terms of the low-temperature stability of the water-based organic solderability preservative, the solubility of the component (D) to water at 20 degrees C. is more preferably 15 g/100 g or more, especially preferably 50 g/100 g or more. It should be noted that, when any amount of the organic solvent can be dissolved in 100 g of water, the solubility of the organic solvent is referred to as "miscible in all proportions."

In terms of the low-temperature stability of the water-based organic solderability preservative, the boiling point of the component (D) is more preferably in a range from 120 degrees C. to 280 degrees C., especially preferably in a range from 180 degrees C. to 260 degrees C. It should be noted that the boiling temperature herein refers to the boiling temperature under a pressure of 1013 hPa.

As long as the above requirements are met, glycol ether solvent, glycol ester solvent, alcohol solvent and the like are usable as the above component (D). Among the above, glycol ether solvent is preferable in terms of the low-temperature stability.

Examples of the component (D) include tripropylene glycol monomethyl ether (solubility miscible in all proportions, boiling temperature: 242 degrees C.), triethylene glycol monobutyl ether (solubility: miscible in all proportions, boiling temperature: 271 degrees C.), propylene glycol monomethyl ether (solubility: miscible in all proportions, boiling temperature: 121 degrees C.), tetraethylene glycol dimethyl ether (solubility: miscible in all proportions, boiling temperature: 275 degrees C.), tetrahydrofurfuryl alcohol (solubility miscible in all proportions, boiling temperature: 178 degrees C.), and propylene glycol monomethyl ether acetate (solubility: 18.5 g/100 g, boiling temperature: 146 degrees C.). Among the above, tripropylene glycol monomethyl ether is preferable in terms of the balance between the low-temperature stability and the formation performance of the protection coating film. Further, these compounds may be singularly used or a mixture of two or more of the compounds may be used. It should be noted that the solubility mentioned in parentheses refers to the solubility to water at 20 degrees C.

The content of the component (D) is preferably in a range from 0.2 mass % to 15 mass % of the total mass (100 mass %) of the water-based organic solderability preservative, more preferably in a range from 0.5 mass % to 10 mass % and especially preferably in a range from 1 mass % to 5 mass %. When the content is less than the above lower limit, the low-temperature stability of the water-based organic solderability preservative tends to become insufficient. On the other hand, when the content exceeds the upper limit, the formation performance of the protection coating is likely to be deteriorated.

Component (E) and Other Component(s)

The component (E) (water) in the exemplary embodiment accounts for the remnant of the water-based organic solderability preservative other than the above components (A), (B), (C), (D) and the other components described below.

Examples of the other components capable of being blended in the water-based organic solderability preservative include: a buffer solution containing a base for metal ions separated from the component (C); and a halogen compound.

Examples of the base in the buffer solution include ammonia, diethylamine, triethylamine, diethanolamine, triethanolamine, monoethanolamine, dimethylethanolamine, diethylethanolamine, isopropylethanolamine, sodium hydroxide and potassium hydroxide.

Examples of the halogen compound include propionic acid bromide and iodopropionic acid. These halogen compounds may be singularly used or a mixture of two or more of the halogen compounds may be used.

When the halogen compound is used, the content of the halogen compound is preferably in a range from 0.01 mass % to 10 mass % of the total mass (100 mass %) of the water-based organic solderability preservative, more preferably in a range from 0.05 mass % to 5 mass %.

Surface Treatment Method and Electronic Board

Next, a surface treatment method and an electronic board of the exemplary embodiment will be described below.

The surface treatment method of the exemplary embodiment includes forming a protection coating on an electrode terminal of the electronic board using the water-based organic solderability preservative.

Examples of the electronic board include a printed circuit board and a semiconductor board.

The formation method of the protection coating includes, for instance, applying a pretreatment including degreasing, chemical polishing (soft etching), pickling and aqueous cleaning on the surface of the electrode terminal of the printed circuit board to be treated, and immersing the printed circuit board in the water-based organic solderability preservative for 1 second to 100 minutes at 10 to 60 degrees C. (preferably for 5 seconds to 60 minutes at 20 to 50 degrees C., more preferably for 10 seconds to 10 minutes at 20 to 50 degrees C.). The compound represented by the above formula (1) adheres on the surface of the electrode terminal through the above process, where the more amount of the compound adheres with the higher processing temperature and the longer processing time. At this time, it is more preferable to use ultrasonic. It should be noted that the other coating means such as sprayer, brush and roller may be used to form the protection coating.

The electronic board of the exemplary embodiment can be produced through the above process. In other words, the electronic board of the exemplary embodiment includes the protection coating formed from the water-based organic solderability preservative.

EXAMPLES

Next, the invention will be described in further detail below with reference to Examples and Comparative Examples. It should be noted, however, that the scope of the invention is by no means limited by the Examples and Comparative Examples. The materials used in Examples and Comparative Examples are as follows.

Component (A)
Imidazole compound: 4-chloro-2-(3-phenyl propyl)benzimidazol
Component (B)
Organic acid A: acetic acid
Organic acid B: tartaric acid
Component (C)
Complex coating formation aid A: zinc chloride
Complex coating formation aid B: zinc bromide
Complex coating formation aid C: potassium iodide
Component (D)
Organic solvent A: tripropylene glycol monomethyl ether (solubility: miscible in all proportions, boiling temperature: 242 degrees C.)
Organic solvent B: triethylene glycol monobutyl ether (solubility: miscible in all proportions, boiling temperature: 271 degrees C.)
Organic solvent C: propylene glycol monomethyl ether (solubility: miscible in all proportions, boiling temperature: 121 degrees C.)
Organic solvent D: tetraethylene glycol dimethyl ether (solubility: miscible in all proportions, boiling temperature: 275 degrees C.)
Organic solvent E: tetrahydrofurfuryl alcohol (solubility: miscible in all proportions, boiling temperature: 178 degrees C.)
Organic solvent F: propylene glycol monomethyl ether acetate (solubility: 18.5 g/100 g, boiling temperature: 146 degrees C.)
Component (E)
Water: pure water
Other Components
Organic solvent G: phenyl glycol (solubility: 2.7 g/100 g, boiling temperature: 245 degrees C.)

Organic solvent H: butylpropylene triglycol (solubility: 0.4 g/100 g, boiling temperature: 274 degrees C.)
Organic solvent I: diethylene glycol dibutylether (solubility: 0.3 g/100 g, boiling temperature: 256 degrees C.)
Organic solvent J: ethyl alcohol (solubility: miscible in all proportions, boiling temperature: 78 degrees C.)
Organic solvent K: isopropyl alcohol (solubility: miscible in all proportions, boiling temperature: 82 degrees C.)

Example 1

A water-based organic solderability preservative was obtained by dissolving, in 96 mass % of water, 1 mass % of the imidazole compound, 2 mass % of the organic acid A, 0.5 mass % of the complex coating formation aid A and 0.5 mass % of the organic solvent A. Further, the pH of the obtained water-based organic solderability preservative was adjusted using a buffer solution in a form of 25 mass % ammonia water to prepare a water-based organic solderability preservative treatment fluid capable of forming a coating.

Examples 2 to 15

The water-based organic solderability preservative and the treatment fluid were obtained in the same manner as in Example 1 except that the composition of the water-based organic solderability preservative was altered as shown in Table 1.

Comparative Examples 1 to 7

The water-based organic solderability preservative and the treatment fluid were obtained in the same manner as in Example 1 except that the composition of the water-based organic solderability preservative was altered as shown in Table 2.

Evaluation of Water-Based Organic Solderability Preservative

The performances of the water-based organic solderability preservative (coating thickness, low-temperature storage stability, re-solubility) were evaluated or measured according to the methods below. The obtained results are shown in Tables 1 to 3.

(1) Coating Thickness

After applying degreasing, soft etching and aqueous cleaning on a double-sided copper-clad laminate (size: 25 mm×50 mm, thickness: 1.6 mm, type of base material: FR-4) to clean the surface of the laminate, the laminate was immersed in the water-based organic solderability preservative treatment fluid for 2 minutes at 40 degrees C., and was subjected to aqueous cleaning and hot-air drying to obtain a test plate. After the coating film on the test plate whose surface area was 25 $cm^2$ was extracted using 50 mL of 0.5% hydrochloric acid, the maximum absorbance derived from effective components of the coating film in the extracted liquid was measured and the coating thickness (unit: μm) was calculated using a conversion equation.

(2) Low-Temperature Storage Stability 100 mL of the water-based organic solderability preservative was collected in a hermetically sealable glass bottle (volume: 120 mL to 150 mL) and the glass bottle was hermetically closed to obtain a sample. The sample was left still in a refrigeration storage in which the temperature was set at 5 degrees C. (within ±2 degrees C. error). Subsequently, the sample was taken out at every 24 hours to visually check the presence of crystals. Then, the low-temperature storage stability was evaluated according to the following standards.

A: No crystal was generated after elapse of 240 hours.

B: Though no crystal was generated after elapse of 168 hours, crystal was generated within 240 hours.

C: Though no crystal was generated after elapse of 48 hours, crystal was generated within 168 hours.

D: Crystal was generated within 48 hours.

(3) Re-Solubility 100 mL of the water-based organic solderability preservative was collected in a hermetically sealable glass bottle (volume: 120 mL to 150 mL) and the glass bottle was hermetically closed to obtain a sample. The sample was left still in a refrigeration storage in which the temperature was set at −15 degrees C. (within ±2 degrees C. error). Subsequently, the sample was taken out after the water-based organic solderability preservative was completely solidified (reference time: 24 hours or more and 48 hours or less). Subsequently, after the sample was left still and heated in a constant-temperature bath in which the temperature was set at 40 degrees C. for an hour, the sample was stirred for an hour at a room temperature using a magnetic stirrer and the presence of a crystal was visually checked when the temperature of the sample was returned to the room temperature. Then, the re-solubility was evaluated according to the following standards.

A: Precipitates completely dissolved.

B: Precipitates remained and not completely dissolved.

TABLE 1

| | | | Examples | | | | | | | | |
|---|---|---|---|---|---|---|---|---|---|---|---|
| | | | 1 | 2 | 3 | 4 | 5 | 6 | 7 | 8 | 9 |
| Composition (Parts by mass) | (D) | Organic solvent A | 0.5 | 1.0 | 2.0 | 4.0 | 6.0 | 10.0 | 15.0 | — | — |
| | | Organic solvent B | — | — | — | — | — | — | — | 2.0 | — |
| | | Organic solvent C | — | — | — | — | — | — | — | — | 6.0 |
| | | Organic solvent D | — | — | — | — | — | — | — | — | — |
| | | Organic solvent E | — | — | — | — | — | — | — | — | — |
| | | Organic solvent F | — | — | — | — | — | — | — | — | — |
| | Other Component | Organic solvent G | — | — | — | — | — | — | — | — | — |
| | | Organic solvent H | — | — | — | — | — | — | — | — | — |
| | | Organic solvent I | — | — | — | — | — | — | — | — | — |
| | | Organic solvent J | — | — | — | — | — | — | — | — | — |
| | | Organic solvent K | — | — | — | — | — | — | — | — | — |
| | (A) | Imidazole compound | 1.0 | 1.0 | 1.0 | 10 | 1.0 | 1.0 | 1.0 | 1.0 | 1.0 |
| | (B) | Organic acid A | 2.0 | 2.0 | 2.0 | 2.0 | 2.0 | 2.0 | 2.0 | 2.0 | 2.0 |
| | | Organic acid B | — | — | — | — | — | — | — | — | — |

TABLE 1-continued

|  |  |  | | | | | | | | | |
|---|---|---|---|---|---|---|---|---|---|---|---|
| (C) | Complex coating formation aid A | 0.5 | 0.5 | 0.5 | 0.5 | 0.5 | 0.5 | 0.5 | 0.5 | 0.5 |
|  | Complex coating formation aid B | — | — | — | — | — | — | — | — | — |
|  | Complex coating formation aid C | — | — | — | — | — | — | — | — | — |
| (E) | Water | 96.0 | 95.5 | 94.5 | 92.5 | 90.5 | 86.5 | 81.5 | 94.5 | 90.5 |
|  | Water-based organic solderability preservative Total | 100.0 | 100.0 | 100.0 | 100.0 | 100.0 | 100.0 | 100.0 | 100.0 | 100.0 |
| Evaluation Results | (1) Coating thickness (μm) | 0.28 | 0.28 | 0.28 | 0.27 | 0.25 | 0.24 | 0.07 | 0.27 | 0.28 |
|  | (2) Low-temperature stability | B | A | A | A | B | B | B | B | B |
|  | (3) Re-solubility | A | A | A | A | A | A | A | A | A |

|  |  |  | | Examples | | | | | |
|---|---|---|---|---|---|---|---|---|---|
|  |  |  | | 10 | 11 | 12 | 13 | 14 | 15 |
| Composition (Parts by mass) | (D) |  | Organic solvent A | — | — | — | 2.0 | 2.0 | 2.0 |
|  |  |  | Organic solvent B | — | — | — | — | — | — |
|  |  |  | Organic solvent C | — | — | — | — | — | — |
|  |  |  | Organic solvent D | 2.0 | — | — | — | — | — |
|  |  |  | Organic solvent E | — | 4.0 | — | — | — | — |
|  |  |  | Organic solvent F | — | — | 1.0 | — | — | — |
|  |  | Other Component | Organic solvent G | — | — | — | — | — | — |
|  |  |  | Organic solvent H | — | — | — | — | — | — |
|  |  |  | Organic solvent I | — | — | — | — | — | — |
|  |  |  | Organic solvent J | — | — | — | — | — | — |
|  |  |  | Organic solvent K | — | — | — | — | — | — |
|  | (A) |  | Imidazole compound | 1.0 | 1.0 | 1.0 | 1.0 | 1.0 | 1.0 |
|  | (B) |  | Organic acid A | 2.0 | 2.0 | 2.0 | 2.0 | 2.0 | — |
|  |  |  | Organic acid B | — | — | — | — | — | 2.0 |
|  | (C) |  | Complex coating formation aid A | 0.5 | 0.5 | 0.5 | — | — | 0.5 |
|  |  |  | Complex coating formation aid B | — | — | — | 0.2 | — | — |
|  |  |  | Complex coating formation aid C | — | — | — | — | 0.2 | — |
|  | (E) |  | Water | 94.5 | 92.5 | 95.5 | 96.8 | 96.8 | 96.5 |
|  |  |  | Water-based organic solderability preservative Total | 100.0 | 100.0 | 100.0 | 102.0 | 102.0 | 102.0 |
| Evaluation Results |  |  | (1) Coating thickness (μm) | 0.28 | 0.29 | 0.25 | 0.34 | 0.25 | 0.25 |
|  |  |  | (2) Low-temperature stability | B | B | B | B | B | B |
|  |  |  | (3) Re-solubility | A | A | A | A | A | A |

TABLE 2

|  |  |  | | Comparative Example | | | | | | |
|---|---|---|---|---|---|---|---|---|---|---|
|  |  |  | | 1 | 2 | 3 | 4 | 5 | 6 | 7 |
| Composition (Parts by mass) | (D) |  | Organic solvent A | — | — | — | — | — | — | — |
|  |  |  | Organic solvent B | — | — | — | — | — | — | — |
|  |  |  | Organic solvent C | — | — | — | — | — | — | — |
|  |  |  | Organic solvent D | — | — | — | — | — | — | — |
|  |  |  | Organic solvent E | — | — | — | — | — | — | — |
|  |  |  | Organic solvent F | — | — | — | — | — | — | — |
|  |  | Other Component | Organic solvent G | — | 1.5 | — | — | — | — | — |
|  |  |  | Organic solvent H | — | — | 0.2 | — | — | — | — |
|  |  |  | Organic solvent I | — | — | — | 0.1 | — | — | — |
|  |  |  | Organic solvent J | — | — | — | — | 30.0 | — | — |
|  |  |  | Organic solvent K | — | — | — | — | — | 30.0 | — |
|  | (A) |  | Imidazole compound | 1.0 | 1.0 | 1.0 | 1.0 | 1.0 | 1.0 | 1.0 |
|  | (B) |  | Organic acid A | 2.0 | 2.0 | 2.0 | 2.0 | 2.0 | 2.0 | — |
|  |  |  | Organic acid B | — | — | — | — | — | — | 2.0 |
|  | (C) |  | Complex coating formation aid A | 0.5 | 0.5 | 0.5 | 0.5 | 0.5 | 0.5 | 0.5 |
|  |  |  | Complex coating formation aid B | — | — | — | — | — | — | — |
|  |  |  | Complex coating formation aid C | — | — | — | — | — | — | — |
|  | (E) |  | Water | 96.5 | 95.0 | 96.3 | 96.4 | 66.5 | 66.5 | 96.5 |
|  |  |  | Water-based organic solderability preservative Total | 100.0 | 100.0 | 100.0 | 100.0 | 100.0 | 100.0 | 100.0 |
| Evaluation Results |  |  | (1) Coating thickness (μm) | 0.29 | 0.22 | 0.14 | 0.11 | 0.03 | 0.04 | 0.24 |
|  |  |  | (2) Low-temperature stability | D | C | D | D | B | B | D |
|  |  |  | (3) Re-solubility | B | B | B | B | B | B | B |

As is clear from the results shown in Tables 1 and 2, it is observed that the water-based organic solderability preservatives (Examples 1 to 15) of the exemplary embodiment are excellent in terms of all of the coating thickness, the low-temperature storage stability and the re-solubility.

Accordingly, it is found that the exemplary embodiment provides a water-based organic solderability preservative having an excellent low-temperature stability.

In contrast, it is observed that the water-based organic solderability preservatives that do not contain the component (D) (Comparative Examples 1 to 7) do not exhibit excellent re-solubility and are not simultaneously excellent in both of the coating thickness and low-temperature storage stability.

What is claimed is:

1. A water-based organic solderability preservative consisting essentially of:
   a component (A) in a form of an imidazole compound;
   a component (B) in a form of an organic acid;
   a component (C) in a form of a complex coating formation aid;
   a component (D) in a form of an organic solvent; and
   a component (E) in a form of water, wherein
   the component (D) in the form of the organic solvent has a solubility to water of 10 g/100 g or more at 20 degrees C., and a boiling temperature in a range from 100 degrees C. to 300 degrees C., and
   the component (D) in the form of the organic solvent is at least one selected from the group consisting of tripropylene glycol monomethyl ether, triethylene glycol monobutyl ether, propylene glycol monomethyl ether, tetraethylene glycol dimethyl ether, and propylene glycol monomethyl ether acetate.

2. A surface treatment method comprising:
   forming a protection coating on an electrode terminal of an electronic board using the water-based organic solderability preservative according to claim 1.

3. A water-based organic solderability preservative consisting essentially of:
   a component (A) in a form of an imidazole compound;
   a component (B) in a form of an organic acid;
   a component (C) in a form of a complex coating formation aid;
   a component (D) in a form of an organic solvent; and
   a component (E) in a form of water, wherein
   the component (D) in the form of the organic solvent has a solubility to water of 10 g/100 g or more at 20 degrees C., and a boiling temperature in a range from 100 degrees C. to 300 degrees C.,
   the component (A) in the form of the imidazole compound is a compound represented by a formula (1),

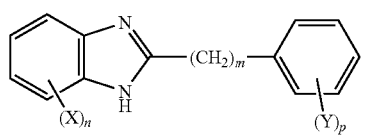

(1)

wherein X and Y are mutually the same or different and each represent at least one selected from the group consisting of a linear or branched alkyl group having 1 to 7 carbon atoms, a halogen atom, an amino group, a di-lower alkyl-amino group, a hydroxy group, a lower alkoxy group, a cyano group, an acetyl group, a benzoyl group, a carbamoyl group, a formyl group, a carboxyl group, a lower alkoxycarbonyl group and a nitro group,
n represents an integer in a range from 0 to 4,
m represents an integer in a range from 0 to 10, and
p represents an integer in a range from 0 to 4,
the component (D) in the form of the organic solvent is tripropylene glycol monomethyl ether, and
the content of the component (D) is in a range from 1 mass % to 4 mass % of the total mass of the water-based organic solderability preservative.

4. A water-based organic solderability preservative consisting essentially of:
   a component (A) in a form of an imidazole compound;
   a component (B) in a form of an organic acid;
   a component (C) in a form of a complex coating formation aid;
   a component (D) in a form of an organic solvent; and
   a component (E) in a form of water, wherein
   the component (D) in the form of the organic solvent has a solubility to water of 10 g/100 g or more at 20 degrees C., and a boiling temperature in a range from 100 degrees C. to 300 degrees C.,
   the component (D) in the form of the organic solvent is tripropylene glycol monomethyl ether,
   the content of the component (D) is in a range from 1 mass % to 4 mass % of the total mass of the water-based organic solderability preservative, and
   the component (A) in the form of the imidazole compound is at least one selected from the group consisting of 2-(3-chloro)benzylbenzimidazole, 2-(3,4-dichloro)benzylbenzimidazole and 4-chloro-2-(3-phenyl propyl) benzimidazole.

5. A water-based organic solderability preservative comprising:
   a component (A) in a form of an imidazole compound;
   a component (B) in a form of an organic acid;
   a component (C) in a form of a complex coating formation aid;
   a component (D) in a form of an organic solvent; and
   a component (E) in a form of water, wherein
   the component (D) in the form of the organic solvent is at least one selected from the group consisting of tripropylene glycol monomethyl ether, triethylene glycol monobutyl ether, propylene glycol monomethyl ether, tetraethylene glycol dimethyl ether, and propylene glycol monomethyl ether acetate, and
   the component (D) in the form of the organic solvent has a solubility to water of 10 g/100 g or more at 20 degrees C., and a boiling temperature in a range from 100 degrees C. to 300 degrees C.

6. The water-based organic solderability preservative according to claim 5, wherein
   the component (A) in the form of the imidazole compound is a compound represented by a formula (1),

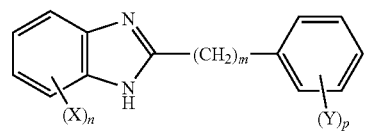

(1)

wherein X and Y are mutually the same or different and each represent at least one selected from the group consisting of a linear or branched alkyl group having 1 to 7 carbon atoms, a halogen atom, an amino group, a di-lower alkyl-amino group, a hydroxy group, a lower alkoxy group, a cyano group, an acetyl group, a benzoyl group, a carbamoyl group, a formyl group, a carboxyl group, a lower alkoxycarbonyl group and a nitro group,
n represents an integer in a range from 0 to 4,
m represents an integer in a range from 0 to 10 and
p represents an integer in a range from 0 to 4.

7. An electronic board comprising a protection coating formed from the water-based organic solderability preservative according to claim 5.

8. A surface treatment method comprising:
forming a protection coating on an electrode terminal of an electronic board using the water-based organic solderability preservative according to claim 5.

9. The water-based organic solderability preservative according to claim 5, wherein
the component (D) in the form of the organic solvent is glycol ether solvent.

10. The water-based organic solderability preservative according to claim 6, wherein
the component (D) in the form of the organic solvent is tripropylene glycol monomethyl ether, and
the content of the component (D) is in a range from 1 mass % to 4 mass % of the total mass of the water-based organic solderability preservative.

11. The water-based organic solderability preservative according to claim 5, wherein
the component (D) in the form of the organic solvent is tripropylene glycol monomethyl ether,
the content of the component (D) is in a range from 1 mass % to 4 mass % of the total mass of the water-based organic solderability preservative, and
the component (A) in the form of the imidazole compound is at least one selected from the group consisting of 2-(3-chloro)benzylbenzimidazole, 2-(3,4-dichloro) benzylbenzimidazole and 4-chloro-2-(3-phenyl propyl) benzimidazole.

* * * * *